United States Patent
Dharmalinggam et al.

(10) Patent No.: US 7,477,098 B2
(45) Date of Patent: Jan. 13, 2009

(54) METHOD AND APPARATUS FOR TUNING AN ACTIVE FILTER

(75) Inventors: Rawinder Dharmalinggam, Singapore (SG); Chinq-shiun Chiu, Hsinchu (TW)

(73) Assignee: MediaTek Singapore Pte Ltd, Ayer Rajah Crescent (SG)

( * ) Notice: Subject to any disclaimer, the term of this patent is extended or adjusted under 35 U.S.C. 154(b) by 16 days.

(21) Appl. No.: 11/672,856

(22) Filed: Feb. 8, 2007

(65) Prior Publication Data

US 2008/0191795 A1    Aug. 14, 2008

(51) Int. Cl.
*H03K 5/00* (2006.01)
(52) U.S. Cl. .................... 327/553; 327/552
(58) Field of Classification Search .......... 327/551–559
See application file for complete search history.

(56) References Cited

U.S. PATENT DOCUMENTS

| | | | |
|---|---|---|---|
| 5,245,646 A | 9/1993 | Jackson et al. | |
| 5,914,633 A | 6/1999 | Comino et al. | |
| 6,417,727 B1 | 7/2002 | Davis | |
| 6,628,163 B2 | 9/2003 | Dathe et al. | |
| 6,646,498 B2 * | 11/2003 | Mohieldin et al. | 327/553 |
| 6,677,814 B2 * | 1/2004 | Low et al. | 327/554 |
| 6,803,813 B1 * | 10/2004 | Pham | 327/553 |
| 6,842,710 B1 * | 1/2005 | Gehring et al. | 702/107 |
| 7,002,404 B2 * | 2/2006 | Gaggl et al. | 327/553 |
| 7,019,586 B2 * | 3/2006 | Dong | 327/553 |
| 7,078,961 B2 * | 7/2006 | Punzenberger et al. | 327/553 |

* cited by examiner

*Primary Examiner*—Dinh T. Le

(57) ABSTRACT

A tuning circuit for tuning an active filter includes a resistor-capacitor circuit comprising a variable capacitor and a resistor equivalent to a first resistor and a second resistor serially connected to the first resistor, a voltage generator for providing a constant reference voltage to the first resistor, a current replicating unit for replicating a current based on the constant reference voltage, a comparator for comparing a charging voltage as the current is charging a variable capacitor with the constant reference voltage, a counter for counting a number of cycles of a clock signal until the charging voltage reaches the constant reference voltage, a adjustment unit for calibrating a capacitance of the variable capacitor based on the number of cycles of a clock signal and a target count value associated with a predetermined RC time constant.

12 Claims, 7 Drawing Sheets

| Mode | Mode selection(Xtal Mode) | $F_{CLK}=1/T_{CLK}$ | Target count value(Target_N) | $F_{tuned}$(MHz) | Error(KHz) ($F_{desired}-F_{tuned}$) |
|---|---|---|---|---|---|
| GPS | 1XXX | 16.368 | 51 | 1.021587494 | 0.21 |
| GSM | 0000 | 13 | 41 | 1.009275249 | 12.52 |
| GSM | 0001 | 26 | 81 | 1.021735437 | 0.06 |
| PDC | 0010 | 12.6 | 39 | 1.028385786 | -6.69 |
| PDC | 0011 | 14.4 | 45 | 1.018591636 | 3.20 |
| WCDMA | 0100 | 15.36 | 48 | 1.018591636 | 3.20 |
| CDMA | 0101 | 19.8 | 62 | 1.016538024 | 5.26 |
| CDMA | 0110 | 19.68 | 61 | 1.026940748 | -514 |
| CDMA | 0111 | 19.2 | 60 | 1.018591636 | 3.20 |

METHOD AND APPARATUS FOR TUNING AN ACTIVE FILTER

BACKGROUND OF THE INVENTION

1. Field of the Invention

The invention relates to a method and apparatus for tuning an active filter, more particularly to a method and apparatus for tuning the 3-dB corner frequency of filters to approach a constant characteristic.

2. Description of the Related Art

As development of integrated circuitry technology is accelerated, necessary functions are integrated within a single chip. In particular, analog filter circuits implemented by capacitors and resistors are widely used in electronics or communication products. In the design and manufacture of active continuous-time filter, the frequency response is directly proportional to variation of the values of resistors and capacitors. As is well known in the art, the use of capacitors and resistors generates RC-product shifts on account of variations in temperature, supply voltage, and manufacturing process. Unavoidably, variation in manufacturing process and variations during operation cause resistance of a resistor with approximately ±21% deviation, and capacitance of capacitor with approximately ±10% deviation. In other words, active filters result in RC time constant deviations from their design value up to ±32%. As a result, tuning circuits may conventionally be used with analog filter circuits in order to fine tune or adjust the filter to compensate for variation in the analog components of the filter.

The employment of integrated active filter circuits in combination with external high precision resistors and capacitors to compensate for the above-mentioned variations is a solution to such problem. However, this solution conflicts with the advantages offered by integrated circuits, such as low cost and small form-factor (few or none external components) of the filter circuit. Therefore, it has become increasingly common to embed an automatic tuning circuit as a part of a chip to calibrate the RC time constant deviation.

Traditionally, calibration of RC time constant is based on two invariant identities to temperature and processing, bandgap voltage and a clock frequency. One way to achieve a tunable RC time constant is to provide active resistors, i.e. resistors fabricated as MOSFETs instead of passive resistor elements, and control the MOSFET to provide a desired resistance. In such an arrangement, a feedback circuit measures the actual RC time constant of the filter with reference to a clock frequency, and provides a corresponding signal to the MOSFET to continuously adjust their resistance to attain the required time constant. This solution, however, needs a continuous input signal for the MOSFET and thus causes an increase of power consumption of the filter circuit. Moreover, this approach is disadvantageous when a low supply voltage is used (e.g. as low as 1 V); since the MOSFET, in general, requires a large sub-1V threshold voltage to be conductive, such that the MOSFET cannot provide a sufficient variable control range to compensate for the large variations of the active filter.

As a result, in order to solve such problem, the need for an improvement on the method and apparatus for tuning an active filter is required.

SUMMARY OF THE INVENTION

It is therefore a primary objective of this invention to provide a tuning apparatus and method for adjusting the capacitance of a capacitor to comply with the desired RC time constant.

Briefly summarized, the claimed invention provides a tuning circuit for tuning an active filter. The tuning circuit comprises a resistor-capacitor circuit, a voltage generator, a current replicating unit, a comparator, a counter, and an adjustment unit. The resistor-capacitor circuit comprises a variable capacitor, a first resistor, and a second resistor serially connected to the first resistor. The voltage generator is used for providing a first constant reference voltage to the first resistor. The first constant reference voltage is converted to a second constant reference voltage through the second resistor. The current replicating unit is used for replicating a first current into a second current with a current replication ratio. The first current is flowing through the first and the second resistors. The comparator is used for comparing a charging voltage across the variable capacitor with the second constant reference voltage when the second current is charging the variable capacitor. The counter is used for counting a number of cycles of a clock signal until the charging voltage reaches the second constant reference voltage. The adjustment unit is used for calibrating a capacitance of the variable capacitor based on the number of cycles of a clock signal and a target count value associated with a predetermined RC time constant.

According to the claimed invention, a method of tuning an RC time constant comprises the steps of providing a target count value associated with a predetermined RC time constant, applying a constant reference voltage to a first resistor being serially connected to a second resistor, generating a second reference voltage based on a ratio of the first resistor to the second resistor, replicating a current based on the constant voltage applied on the first resistor, comparing a charging voltage as the current is charging a variable capacitor against the second constant reference voltage, counting a number of cycles of a clock signal with a counter as the current is charging the variable capacitor, and adjusting a capacitance of the variable capacitor to comply with the predetermined RC time constant based on the number of cycles of the clock signal and the target count value.

The disclosed inventions will be described with reference to the accompanying drawings, which show important sample embodiments of the invention and which are incorporated in the specification hereof by reference.

BRIEF DESCRIPTION OF THE DRAWINGS

FIG. 4 is an example of a target count table illustrating a relationship of clock frequency and target count value for various communication systems.

DETAILED DESCRIPTION OF THE PREFERRED EMBODIMENT

Figure 1:
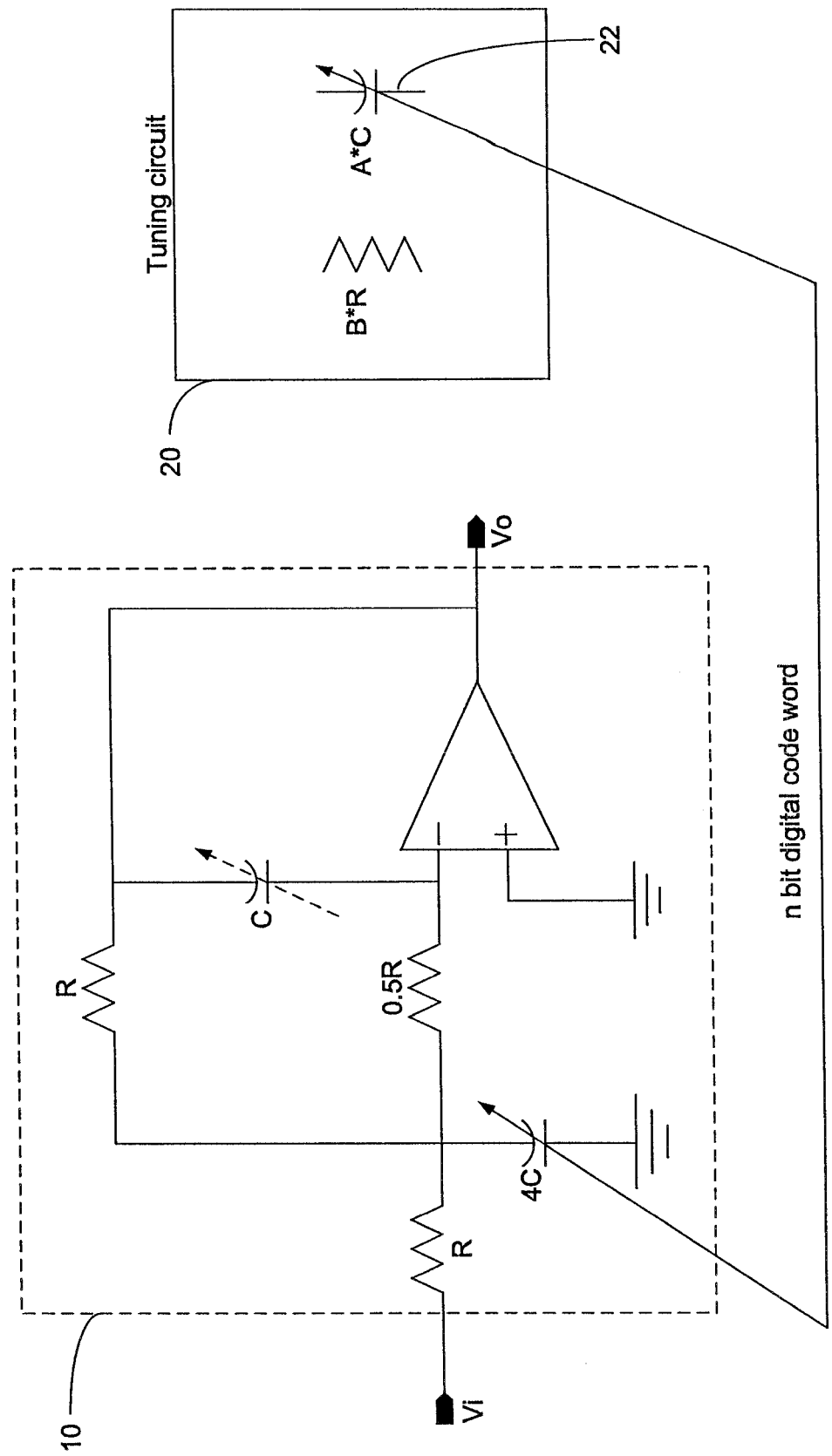
FIG. 1 shows a block diagram of a tuning circuit for tuning an RC circuitry in accordance with the present invention.

Referring to FIG. 1, as shown is a block diagram of a tuning circuit 20 for tuning an RC circuitry 10 in accordance with the preferred embodiment of the present invention. The RC circuitry 10 comprises resistors and capacitors which are all made on a wafer and associated with a variable capacitor 22 of the tuning circuit 20. When both tuning circuit and the active filter are implemented in the same integrated circuit, variations in capacitors (resistors) will generally directly track with variations in capacitor (resistor) of the tuning circuit provided that all of the capacitors (resistors) are fabricated to be of the same type and physical orientation. Therefore, the RC time constants of both circuits are directly proportional. With good matching, each capacitance value of capacitors on the same wafer has almost identical error of capacitance. Thus the tuning circuit 20 can measure any capacitor on the wafer to determine the capacitance error and feedback such error to compensate capacitance of all the capacitors on the wafer to achieve the desired RC time constant.

Figure 2:
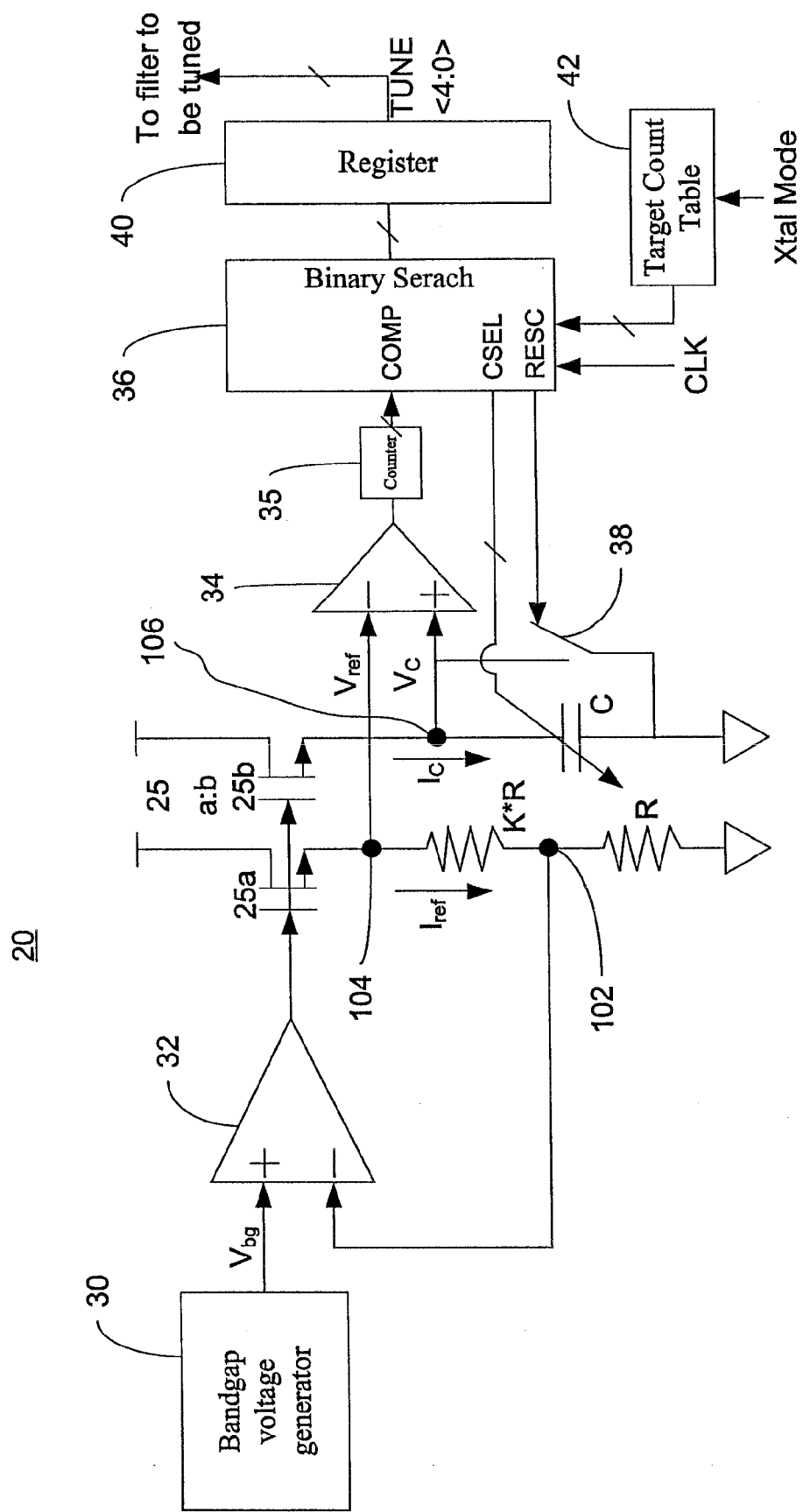
FIG. 2 shows a circuit diagram of a preferred embodiment of the tuning circuit depicted in FIG. 1.

FIG. 2 shows a circuit diagram of a preferred embodiment of the tuning circuit 20 depicted in FIG. 1. A bandgap voltage generator 30 outputs a steady bandgap voltage $V_{bg}$ to ensure consistency and stability over variations in supply voltage and operating temperature. Due to virtual ground effect of an operational amplifier 32, voltage at node 102 is virtually the same as bandgap voltage $V_{bg}$. So current $I_{ref}$ flowing through resistor R equals to $V_{bg}/R$, while reference voltage $V_{ref}$ at node 104 equals to $(K+1)V_{bg}$. Meanwhile, through replication of the current $I_{ref}$ by using the current mirror 25, current $I_C$ flowing to a capacitor C equals to $I_C=(V_{bg}/R)\times(b/a)$, where factors a, b indicate current replication ratio of MOSFETs 25a and 25b respectively. Moreover, the resistor with a resistance of K×R is serially connected to the resistor with a resistance of R. It should be appreciated that, by appropriately selecting a resistor with the resistance of K×R, the current $I_{ref}$ can be properly reduced depending on the designers' requirement thru realization of a desired $V_{ref}=(K+1)V_{bg}$ by varying K value.

Figure 3:
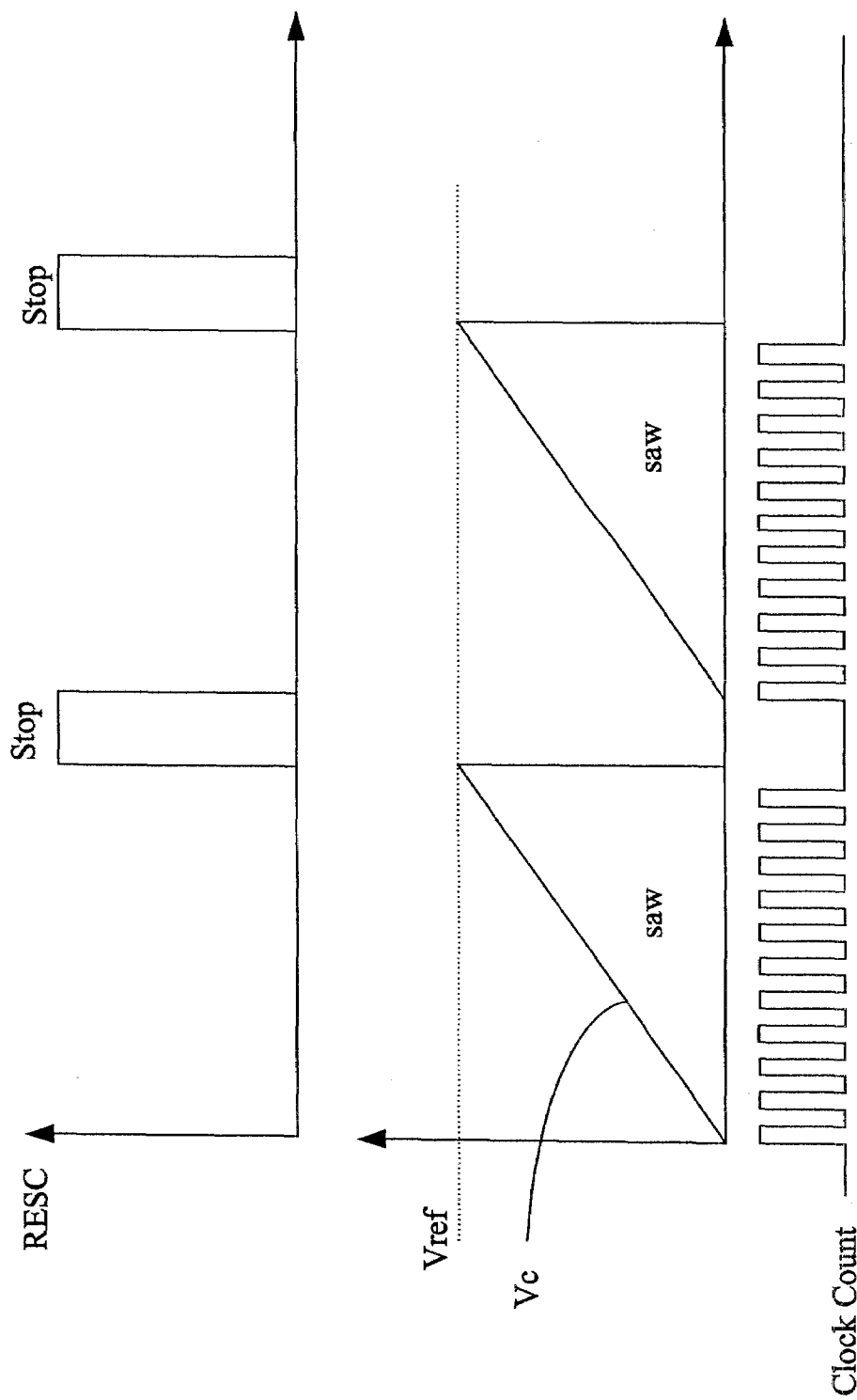
FIG. 3 illustrates a timing diagram associated with reference voltage signal $V_{ref}$ and voltage drop across variable capacitor C depicted in FIG. 2.

In conjunction with FIG. 2, FIG. 3 illustrates a timing diagram associated with reference voltage $V_{ref}$ at node 104 and voltage drop $V_C$ across capacitor C depicted in FIG. 2. A comparator 34 compares the reference voltage $V_{ref}$ with voltage drop $V_C$ across the capacitor C which rises as the current $I_C$ charges the capacitor C. In the meantime, a counter 35 operates based on a system clock signal CLK connected thereto. During the time period $T_{saw}$ in which the counter 35 is enabled, the counter 35 is counting the number N of clock cycles of the system clock signal CLK. When the rising voltage drop $V_C$ matches the reference voltage signal $V_{ref}$, the comparator 34 sends a stop signal to the counter 35 to stop counting, and then the counter 35 outputs the count value N to an input COMP of an adjustment unit 36. The adjustment unit 36 sends a reset signal RESC in response to the reception of input COMP to a switch 38 (can be implemented by a MOSFET) to form a discharge route for the capacitor C. When receiving the reset signal RESC, the switch 38 turns on and thus the capacitor C discharges. In a time period $T_{saw}$ of charging the capacitor C, charge Q accumulated in the capacitor C can be expressed as:

$$Q = T_{saw} \times I_c = T_{saw} \times (V_{bg}/R) \times (b/a) = C \times V_c \times C \times (K+1) \times V_{bg},$$

where factor C indicates capacitance of the capacitor C. Therefore, the measured time period $T_{saw}$ of charging the capacitor C is concluded as a function of $T_{saw}=C\times R\times a/b\times(K+1)$, where factors a, b and K are known. For the system clock signal CLK is a conformed and stable signal, the measured time period $T_{saw}$ is precisely obtained by summing the number N of clock cycles which are counted by the counter 35. In other words, once an output of the counter 35 which is represented as $T_{saw}/T_{CLK}$ (where $T_{CLK}$ represents the period of the system clock) is obtained, the measured time period $T_{saw}$ is obtained as well.

With reference to FIG. 3, the measured RC time constant of the tuning circuit 20 is accordingly obtained resulting from provided factors a, b, K and measured $T_{saw}$. Upon receiving the count value N which indicates the measured time period $T_{saw}$, the adjustment unit 36 compares the count value N with a target count value TARGET_N stored in a target count table 42. The target count value TARGET_N is indicative of a predetermined RC time constant. Furthermore, the target count table 42 contains a plurality of cycle values of the clock signals and a plurality of target count values corresponding to the plurality of cycle values of the clock signals. Referring to FIG. 4, which is an example of a target count table 42 illustrating a relationship of clock frequency $F_{CLK}$ and target count value for various communication systems, the target count table 42 is capable of selecting a corresponding target count value and the clock signal CLK according to a mode selecting signal Xtal_Mode. Since a tuned frequency $F_{tuned}$ of a communication system is proportional to $F_{CLK}/\text{TARGET\_N}$, $F_{tuned}$ can be expressed as:

$$F_{tuned} = \frac{b}{a} \times \frac{F_{CLK}}{2\pi \times \text{TARGET\_N}}.$$

On account of various clock frequencies $F_{CLK}$ for use in various communication systems, by assigning the values of the clock frequency $F_{CLK}$ and target count value TARGET_N in the target count table 42, $F_{tuned}$ can change accurately. As an example, if detecting a mode selection signal Xtal_Mode of digital logical value "0000", the target count table 42 determines the frequency of a clock signal of 13 MHz and a target count value TARGET_N of 41, and delivers the target count value of 41 to the adjustment unit 36. In doing so, the adjustment unit 36 outputs a tuning code CSEL based on the difference between the target count value TARGET_N and the measured count value N to adjust the capacitance of the capacitor C. For example, a system clock signal CLK with a time period of 50 ms is given and an RC time constant of 1000 ms for the tuning circuit is desired. When the count value N of the clock cycles counted by the counter 35 equals to 19, the resulting measured RC time constant of 950 ms is less than the desired RC time constant of 1000 ms. The adjustment unit 36 senses the difference and generates the tuning code CSEL accordingly, in this case, to increase the capacitance of the capacitor C, so that the measured RC time constant is closer to the desired RC time constant of 1000 ms. This process is repeated until the difference in time constants is acceptably small, and a final tuning code CSEL results, which is in turn copied to a register 40 with an output code TUNE<4:0>. Consequently, capacitance of a capacitor in a filter is calibrated based on the final tuned code TUNE<4:0> stored in the register 40.

Figure 5:
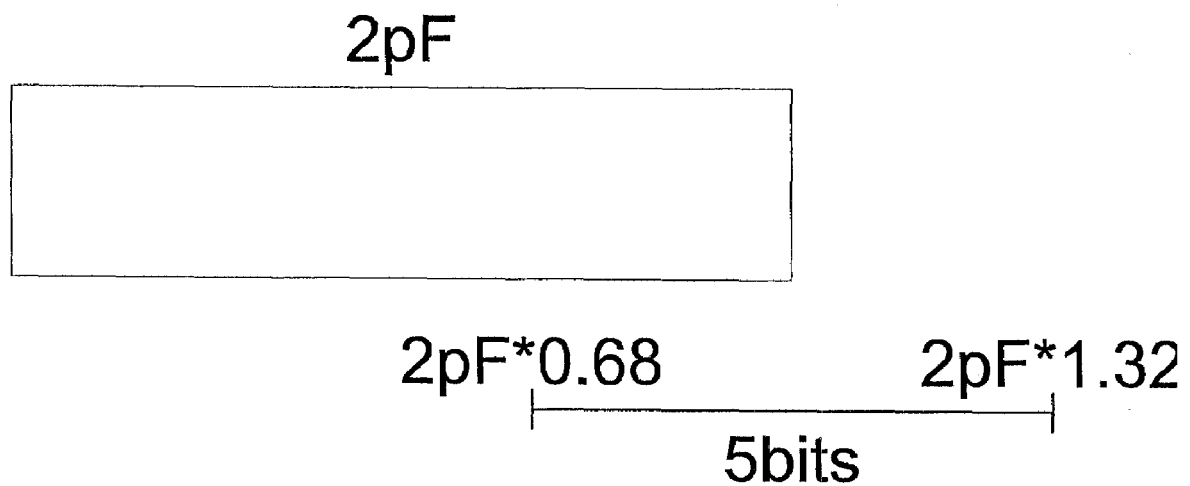
FIG. 5 shows an example of a nominal design capacitance of a variable capacitor.

Referring to FIG. 5, as shown is an example of a nominal design capacitance of a variable capacitor. Assume that the variable capacitor with a ±32% tuning range, which can be digitally represented with 5 bits (i.e. tuning bits TUNE<4:0>), has a nominal capacitance of 2 pF. This means that a Least Significant Bit (LSB) of tuning bits is indicative of 40 fF ($2pF*0.64/2^5$). Accordingly, the capacitance of the variable capacitor can be digitally adjusted to achieve an RC compensation in approximate range of ±32%. Certainly, as the one skilled in the art is aware, any other range may be selected in conformance with the application for which the active filter circuit is used.

Figure 6:
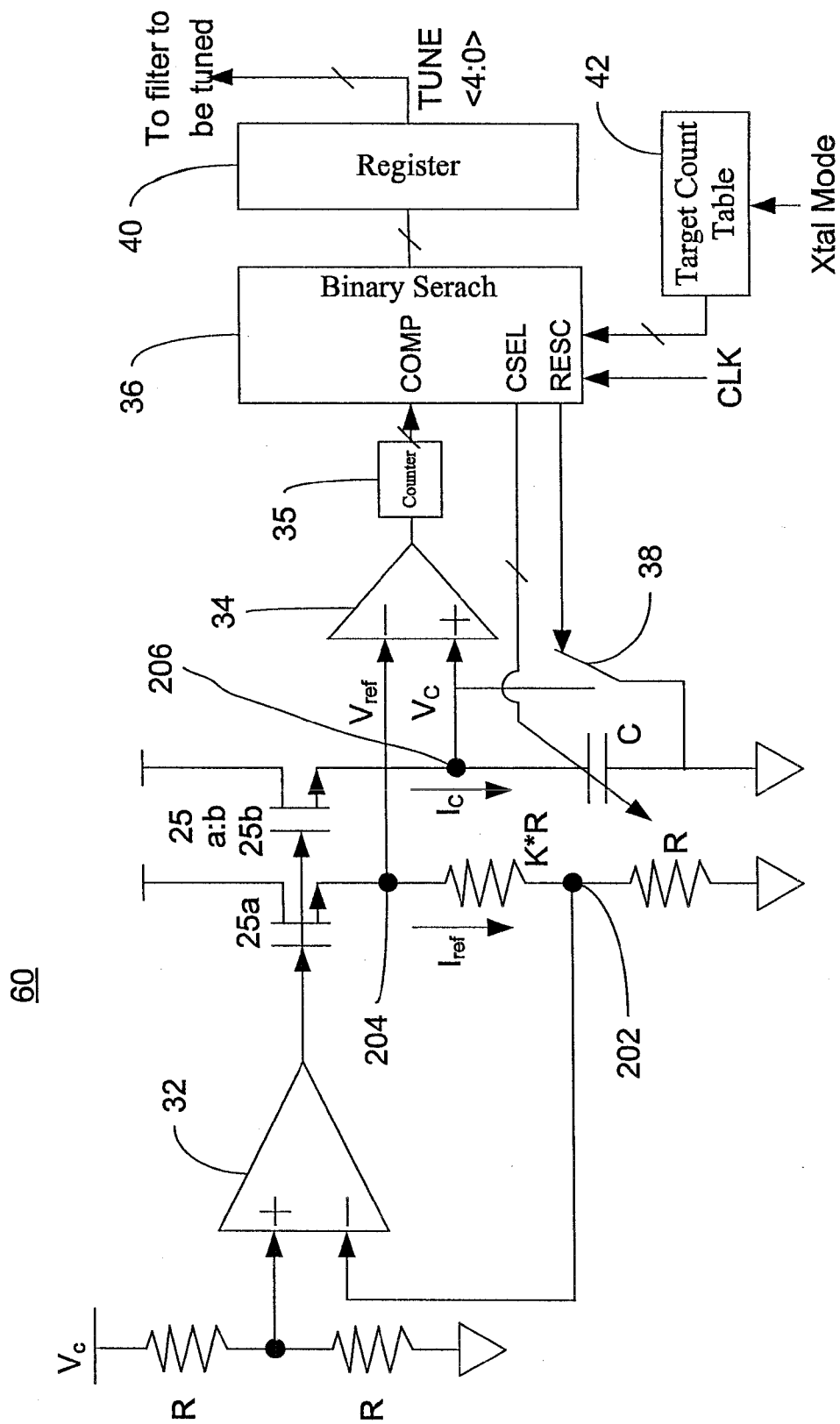
FIG. 6 shows another embodiment of tuning circuit in accordance with the present invention.

In conjunction to FIG. 3, FIG. 6 shows another embodiment of tuning circuit 60 in accordance with the present invention. It is noted that, for simplicity, elements in FIG. 6 that have the same function as that illustrated in FIG. 2 are provided from FIG. 2, this embodiment uses a DC voltage dividing circuit in lieu of the bandgap voltage generator. Voltage value at node 202 is $\frac{1}{2}\times V_C$ due to virtual ground effect of an operational amplifier 32. So current $I_{ref}$ flowing through resistor R equals to $(\frac{1}{2} \times V_C)/R$, while reference voltage $V_{ref}$ at node 204 equals to $(\frac{1}{2} \times Vc) \times (K+1)$. Meanwhile, through replication of the current $I_{ref}$ by using the current mirror 25, current $I_C$ flowing to a capacitor C equals to $I_C = (b/a) \times (\frac{1}{2} \times VC)/R$, where factors a and b indicate current replication ratio of MOSFETs 25a and 25b respectively. Moreover, the resistor with a resistance of K×R is serially connected to the resistor with a resistance of R. It should be appreciated that, by appropriately selecting a resistor with the resistance of K×R, the current $I_{ref}$ can be properly reduced depending on the designers' requirement thru realization of a desired $V_{ref} = (K+1)V_{bg}$ by varying K value.

With reference to FIG. 6 and FIG. 3, a comparator 34 compares the reference voltage $V_{ref}$ of $(\frac{1}{2} \times V_C) \times (K+1)$ with voltage drop $V_C$ across the capacitor C which rises as the current $I_C$ charges the capacitor C. In the meantime, a counter 35 is enabled based on a system clock signal CLK connected thereto. In the meantime, a counter 35 operates based on a system clock signal CLK connected thereto. During the time period $T_{saw}$ in which the counter 35 is enabled, the counter 35 is counting the number N of clock cycles of the system clock signal CLK. When the rising voltage drop Vc matches the reference voltage signal $V_{ref}$, the comparator 34 sends a stop signal to the counter 35 to stop counting, and then the counter 35 outputs the count value N to an input COMP of a adjustment unit 36. The adjustment unit 36 sends a reset signal RESC in response to the reception of input COMP to a switch 38 (can be implemented by a MOSFET) to form a discharge route for the capacitor C. When receiving reset signal RESC, the switch 38 turns on and thus the capacitor C discharges. In a time period $T_{saw}$ of charging the capacitor C, charge Q accumulated in the capacitor C can be expressed as:

$$Q = T_{saw} \times Ic = T_{saw} \times (b/a) \times (\frac{1}{2} \times V_C)/R = C \times V_C = C \times (\frac{1}{2} \times V_C) \times (K+1),$$

where factor C indicates capacitance of the capacitor C.

Therefore, a measured time period $T_{saw}$ of charging the capacitor C is concluded as a function of $T_{saw} = C \times R \times (K+1) \times a/b$, where factors K, a, and b are known. For the system clock signal CLK is a conformed and stable signal, the measured time period $T_{saw}$ is precisely obtained by summing the number N of clock cycles which are counted by the counter 35. In other words, once an output of the counter 35 which is represented as $T_{saw}/T_{CLK}$ (where $T_{CLK}$ represents the period the system clock) is obtained, the measured time period $T_{saw}$ is obtained as well. In this way, the measured RC time constant of the tuning circuit 60 is accordingly obtained resulting from provided factors a, b, K and measured $T_{saw}$. It should be noted that even if the bias voltage $V_C$ may be different for different ICs (e.g. one is operated at 2.9V, yet another one is operated at 2.8V), the measured RC time constant remains unchanged. So the RC time constant deviation is easily and precisely obtained. Finally, as described above, the counter 35, the adjustment unit 36 and the register 40 perform the same function to tune the active filter 10.

Figure 7:
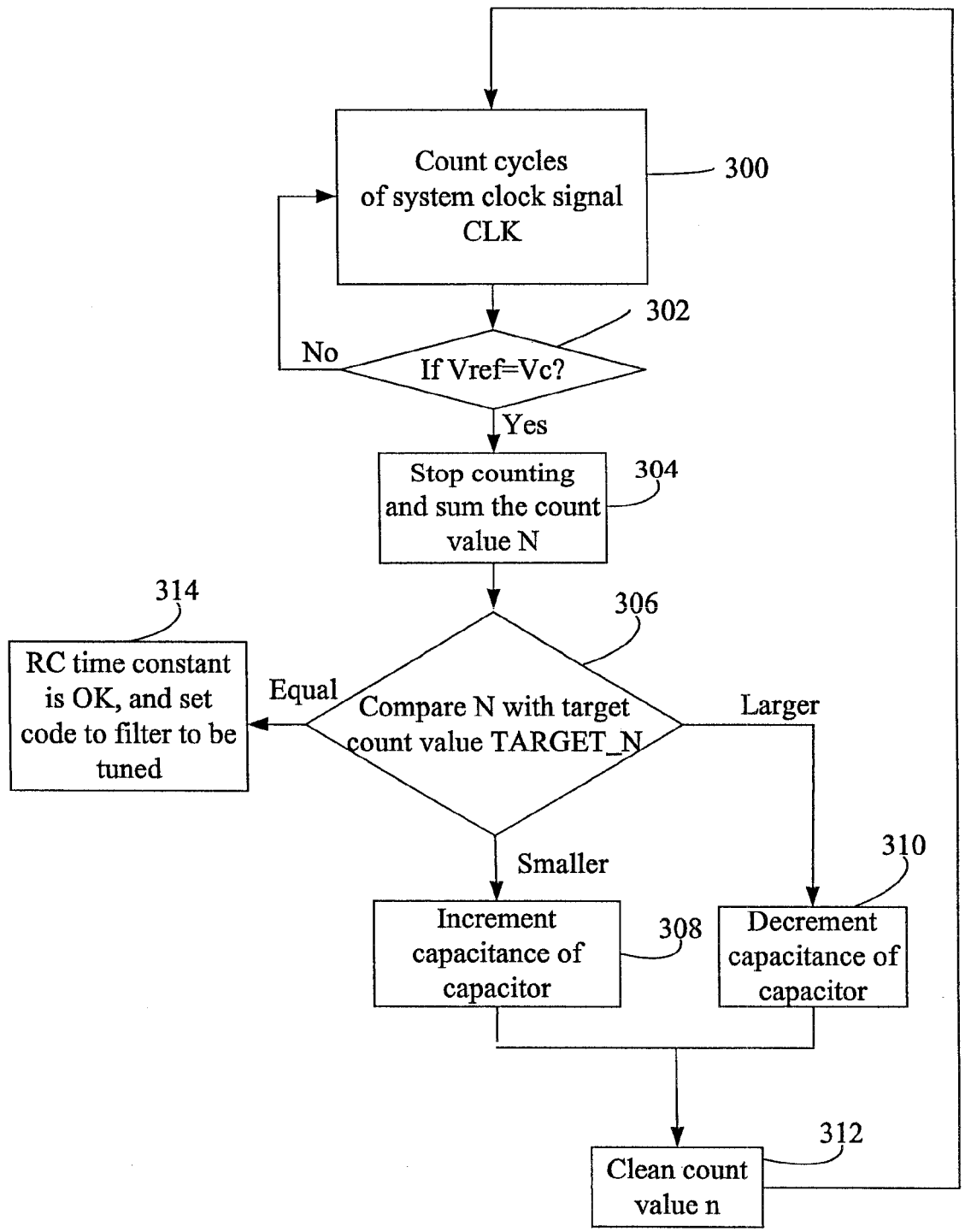
FIG. 7 shows a flowchart of tuning the RC time constant according to the present invention.

Referring to FIG. 7, as shown is a flowchart of tuning the RC time constant according to the present invention.

Step 300: Count cycles of system clock signal CLK.

Step 302: Compare the DC reference signal $V_{ref}$ with the voltage drop $V_C$ across the capacitor C.

Step 304: If the voltage drop $V_C$ across the capacitor C equals to $V_{ref}$, stop counting and sum the count number N.

Step 306: Compare count value N with target count value TARGET_N.

Step 308: If the count value N is smaller than the target count value TARGET_N, increment capacitance of the capacitor C.

Step 310: If the count value N is larger than the target count value TARGET_N, decrement capacitance of the variable capacitor.

Step 312: Clean count value N.

Step 314: RC time constant is OK, and set code to filter to be tuned.

According to the present inventive method, if the count value N does not equal to a target count value TARGET_N which is defined by desired RC time constant of the active filter, i.e. the measured RC time-constant has error relative to the desired RC time-constant, the variable capacitor C is updated with a new capacitance defined by the tuning code CSEL of the adjustment unit 36. Because the new capacitance leads to a new count value N due to a change of RC product, Step 300 is repeated. When the new count value N equals to the target count value TARGET_N, the calibration process is complete, indicating that a product of the new capacitance and the resistance of the resistor complies with the desired RC time constant. As a result, the new capacitance code (i.e. tuning bits TUNE<4:0>) is set to the filter to adjust capacitance of capacitor (Step 314).

In contrast to prior art, the present invention utilizes a comparison of a DC reference voltage and an AC voltage across a variable capacitor to determine an actual RC time constant of an active filter. Then, the measured RC time constant of the filter is compared with a predetermined RC time constant and is converged on it. The variable capacitor is adjusted to keep the filter circuit within a desired RC range. Due to the use of passive resistors instead of MOSFETs, the filter is highly linear. Moreover, the RC time constant of the filter is determined by a digital code provided to the tuning circuit. Although the accuracy of the RC time constant is limited by the number of bits of the digital code, and the nominal value of the LSB of the variable capacitor, a range of the +/−32% for the corner frequency of the filter is sufficient for many low to medium frequency applications. In addition, a flexible use of the resistor advances a reduction of the current $I_{ref}$, so that the designers are apt to design different tuning circuits for various filters used in various systems.

The present invention has been described with reference to certain preferred and alternative embodiments which are intended to be exemplary only and not limited to the full scope of the present invention as set forth in the appended claims.

What is claimed is:

1. A tuning circuit in a system providing a clock signal for tuning an active filter corresponding to a target count value indicative of a predetermined RC time constant of the active filter, the tuning circuit comprising:

a resistor-capacitor circuit comprising a variable capacitor, a first resistor, and a second resistor serially connected to the first resistor;

a voltage generator for providing a first constant reference voltage to the first resistor, the first constant reference voltage being convened to a second constant reference voltage through the second resistor;

a current replicating unit for replicating a first current into a second current with a current replication ratio, the first current being flowing through the first and the second resistors, and the second current being flowing through the variable capacitor;

a comparator for comparing a charging voltage across the variable capacitor with the second constant reference voltage when the second current is charging the variable capacitor;

a counter coupled to the comparator, for counting a number of cycles of the clock signal until the charging voltage reaches the second constant reference voltage; and an adjustment unit coupled to the counter, for calibrating a capacitance of the variable capacitor based on the number of cycles of the clock signal and the target count value.

2. The tuning circuit of claim 1, wherein the adjustment unit is a binary search unit performing a binary search operation to calibrate the capacitance of the variable capacitor.

3. The tuning circuit of claim 1 further comprising:
a switch, coupled with the variable capacitor, for forming a discharge route for the variable capacitor if the charging voltage reaches the second constant reference voltage.

4. The tuning circuit of claim 1 further comprising a target count table for storing a plurality of candidate target count values corresponding to a plurality of cycles of the clock signal, and for determining the target count value from the plurality of candidate target count values.

5. The tuning circuit of claim 1 wherein the current replicating unit is a current mirror.

6. The tuning circuit of claim 1 wherein the voltage generator comprises a voltage dividing circuit for generating the first constant reference voltage by dividing a direct current (DC) voltage.

7. The tuning circuit of claim 1 wherein the voltage generator provides the first constant reference voltage dependent on a bandgap voltage from a bandgap voltage generator.

8. A method of tuning an active filter in a system providing a clock signal, the method comprising:
providing a target count value indicative of predetermined RC time constant corresponding to the active filter;
applying a first constant reference voltage to a first resistor being serially connected to a second resistor;
generating a second reference voltage based on a ratio of the first resistor to the second resistor;
replicating a current based on the first constant reference voltage applied on the first resistor;
comparing a charging voltage across a variable capacitor as the current is charging the variable capacitor against the second constant reference voltage;
counting a number of cycles of the clock signal with a counter as the current is charging the variable capacitor; and
adjusting a capacitance of the variable capacitor to comply with the predetermined RC time constant based on the number of cycles of the clock signal and the target count value.

9. The method of claim 8 further comprising:
discharging the variable capacitor if magnitudes of the charging voltage and the second constant reference voltage are matched.

10. The method of claim 8 further comprising a step of determining the target count value from a plurality of candidate count values stored in a target count table.

11. The method of claim 10 further comprising determining the target count value and the cycle of the clock signal selected from a plurality of candidate target count values and a plurality of cycles of candidate clock signals stored in the target count table.

12. The method of claim 8 further comprising performing a binary search operation to calibrate the capacitance of the variable capacitor.

* * * * *